(12) United States Patent　　(10) Patent No.: US 7,248,531 B2
Pyeon et al.　　(45) Date of Patent: Jul. 24, 2007

(54) VOLTAGE DOWN CONVERTER FOR HIGH SPEED MEMORY

(75) Inventors: Hong Beom Pyeon, Kanata (CA); Bruce Millar, Stittsville (CA)

(73) Assignee: Mosaid Technologies Incorporated, Kanata, Ontario (CA)

( * ) Notice: Subject to any disclaimer, the term of this patent is extended or adjusted under 35 U.S.C. 154(b) by 61 days.

(21) Appl. No.: 11/195,641

(22) Filed: Aug. 3, 2005

(65) Prior Publication Data

US 2007/0030749 A1　　Feb. 8, 2007

(51) Int. Cl.
　　*G11C 5/14*　　(2006.01)
(52) U.S. Cl. .................. 365/226; 365/189.11
(58) Field of Classification Search ................ 365/226, 365/189.11, 189.09
See application file for complete search history.

(56) References Cited

U.S. PATENT DOCUMENTS

| | | | |
|---|---|---|---|
| 4,254,372 A | | 3/1981 | Moore, Jr. |
| 4,395,675 A | | 7/1983 | Tounami |
| 5,493,234 A | | 2/1996 | Oh |
| 5,563,500 A | | 10/1996 | Muterspaugh |
| 6,072,742 A | * | 6/2000 | Ooishi ........................ 365/226 |
| 6,281,744 B1 | | 8/2001 | Kang |
| 6,407,538 B1 | * | 6/2002 | Kinoshita et al. ............ 323/314 |
| 6,414,881 B1 | * | 7/2002 | Fujii et al. ............. 365/189.09 |
| 6,806,692 B2 | | 10/2004 | Lee |
| 6,897,638 B2 | | 5/2005 | Miyanaga et al. |

OTHER PUBLICATIONS

Tanaka, "A Precise On-Chip Voltage Generator for a Gigascale DRAM with a Negative Word-Line Scheme", *IEEE Journal of Solid-State Circuits*, vol. 34, No. 8, Aug. 1999, pp. 1084-1090.

* cited by examiner

*Primary Examiner*—Anh Phung
(74) *Attorney, Agent, or Firm*—Anne Kinsman; Borden Ladner Gervais LLP

(57) ABSTRACT

A voltage down converter (VDC) applicable to high-speed memory devices. The VDC includes a steady driver and active driver along with at least one additional transistor. The steady driver and active driver are coupled by a transistor switch during device start-up to provide fast ramp-up to operating voltage and current. After start-up, the steady driver and active drive function to maintain a steady operating voltage and current. An additional transistor is digitally controlled to drive up operating voltage and current upon issuance of an active command representing read, write, and/or refresh of memory. In this manner, the additional transistor provides fast compensation for fluctuations in operating voltage and current brought on by activity in the memory array.

9 Claims, 7 Drawing Sheets

Vr < Vpp_ref --> PMOS: strong turn-on
Vr > Vpp_ref --> PMOS: weak turn-on

Vr ∼ Vpp_ref by regulator (comparator operation)

VOLTAGE DOWN CONVERTER FOR HIGH SPEED MEMORY

FIELD OF THE INVENTION

The invention relates generally to a voltage down converter that provides a supply voltage and current to a memory device to minimize voltage supply variation and improve power consumption. More particularly, the invention relates to a voltage, down converter used in high speed memory devices.

BACKGROUND OF THE INVENTION

Voltage Down Converters (VDCs) are used to lower the level of an external power supply voltage (e.g., $V_{ddq}$) provided to a semiconductor device to a desired internal power supply voltage (e.g., $V_{dd}$). For example, a voltage down converter in a semiconductor integrated circuit may lower an external power supply voltage to the level of an internal power supply voltage, so that each component element within the integrated circuit may be operated with the internal power supply voltage to reduce power consumption and secure sufficient reliability of each component element. Another use of the VDC in the area of high-speed memory devices such as dynamic random access memories (DRAM), is the generation of a substantially constant high supply voltage that is greater than the logic "1" voltage level stored in a memory cell.

A fast voltage down converter can be used as a substantially constant high voltage supply for providing a power supply voltage (e.g., $V_{pp}$) to the memory device. This is particularly important within high speed embedded memory devices having small die area available on a system-on-a-chip (SOC) application. When the die area is small, i.e. in an embedded memory implementation, there is inadequate capacitive loading on a high voltage supply output in order to store the charge necessary to maintain a substantially constant supply voltage. Moreover, the operating frequency of current memory devices now exceeds 800 MHz in most leading edge embedded memory applications. A fast response of the voltage down converter is an important factor in providing a substantially constant high supply voltage $V_{pp}$ to the memory. The stability of the substantially constant high supply voltage $V_{pp}$ during the different modes of operation of the memory, greatly depends on the capacitive loading and the reservoir capacitance of the voltage supply output. The capacitive loading is created by the sum of all elements having an inherent capacitance (for example transistor gates) that are mutually connected to the Vpp output node.

The reservoir capacitance is typically a separate dedicated large capacitance that is connected to the Vpp output to provide further capacitive loading and stability on the output in addition to the inherent aforementioned capacitive loading on the Vpp output. However, the small size of embedded memory devices creates some problems of stability in the required internal level supply. Active operations that take place in the memory, i.e. read, write and/or refresh operations, contribute to create a ripple effect on the voltage level $V_{pp}$ given the current load that such operations provide. The voltage ripple level is affected by the total capacitance such that $$V_{ripple} \sim I_{LOAD} * T/(C_{LOAD} + C_{RESVOIR}),$$

where $I_{LOAD}$ is the leakage or operating current and $C_{LOAD}$ is the total loading of the $V_{pp}$ voltage. Since the load and reservoir capacitances are small in embedded memory applications, the ripple voltage level becomes very dependent on fluctuations in load current, which can occur based on different current loading scenarios. Because of this problem, embedded memories experience significant voltage supply fluctuation.

The common solution for this fluctuation problem has been to insert as large a reservoir capacitor as possible in order to hold the voltage level provided by the voltage down-converter VDC as stable as possible. One such conventional solution 100 is shown in FIG. 1A. However, a key issue of embedded memory is their small size that does not allow adequate space in order to place such a large reservoir capacitor. In such instance as in FIG. 1A, either $C_{LOAD}$ or $C_M$ would have to be adjusted to be a very high capacitance in order to provide the necessary stability for the voltage-down conversion. Because $C_{LOAD}$ represents the whole memory array and such arrays are becoming increasingly smaller, the result is that $C_M$ would need to be increased significantly. However, increasing $C_M$ results in an increased penalty area that, in the case of embedded applications, is one of the major design constraints.

An alternative approach as shown in a prior art voltage down converter FIG. 1B is to add an additional transistor to the output of the voltage down converter in order to supply fluctuating current demands of the memory. However, this solution is not appropriate for embedded memories that have many diverse operations such as single read and write or read or write concurrent with a refresh operation, each type of operation sinking different amounts of current depending on the process, voltage, or temperature variations. Furthermore, the inherent delay of the comparators used in this approach is not sufficient to maintain a steady voltage level in the voltage down converter output. This is especially the situation in memories operating at high frequencies.

Several other conventional VDCs are shown in U.S. Pat. No. 6,806,692 issued to Lee. In such memory devices, a VDC may be used in various applications to supply large amount of "AC" type current (e.g., alternating or fluctuating current) while sustaining the necessary "DC" type current (e.g., a fixed current) and a steady DC voltage level. The conventional VDC design has some drawbacks when employed in modern applications, which often require large, fluctuating output currents. To provide a large current, the VDC will typically require a relatively large source follower transistor. In order to drive such a large transistor, a corresponding comparator has to be relatively powerful. The relatively large transistor and comparator size results in substantial and undesirable current consumption for the VDC. Also, the feedback or coupling capacitor must be relatively large in size to stabilize the VDC. The performance-to-power ratio of this type of conventional VDC diminishes with increasing current supply requirements. In the presence of increasing current demands and high frequencies of operation, the conventional VDC eventually becomes sluggish to supply adequate AC current for digital circuits. When such a scenario occurs, the VDC cannot maintain the output voltage $V_{pp}$ at a steady level and voltage level dipping occurs. In a DRAM chip, a large dip in voltage level can cause memory cells to fail. Accordingly, there is a need to keep $V_{pp}$ stable even while the memory device is operated at high frequencies for various operations each requiring high current demands.

The VDC 110 in prior art FIG. 1B includes comparators 170 and 171, a relatively large PMOS (positive channel metal oxide semiconductor) transistor 151 and a relatively small PMOS transistor 152, and a feedback compensation or coupling capacitor Pcc. Comparators 170 and 171 receive two inputs, a reference voltage (Vref) input and feedback loop input (Vfb). The output of the comparator 170 is coupled to the gate of transistor 151 while the output of the comparator 171 is coupled to the gate of transistor 171 and to the gate of transistor 153. Transistor 170 has a high gain but a low speed response to the signal that it receives in its gate, while transistor 171 has a low gain but a high frequency response.

The prior art VDC 110 as shown in FIG. 1B does not operate well for high frequency memories. This is due to the fact that the analog circuit shown by VDC 110 is inherently slow and cannot function well within ever increasing memory speeds where activity on the load is quickly changing. More specifically, the comparator requires a minimum difference between the reference voltage and the feedback voltage in order to change its output and to increase or decrease the current provided to the output node D1.

There is therefore a need for a new and improved voltage down converter for use with high speed memory devices, which can provide relatively large output currents and voltages, which minimizes voltage variations during operation, and which has improved stability and robustness.

SUMMARY OF THE INVENTION

The object of the invention is to remedy the drawbacks set out above by providing a voltage down converter that including an active driver having little driving capability with additional transistor pairs having separate digital control outputs and precisely controlling the down-voltage and stabilize the down voltage level without adding a huge reservoir capacitor.

In a preferred embodiment, the present invention includes a voltage down converter for providing a supply voltage and current to a high-speed memory device, having a first driver circuit including a first comparator and a steady driver transistor having a large transistor width; a second driver circuit including a second comparator and an active driver transistor having a small transistor width relative to the steady driver; a first logic circuit for connecting the first driver circuit and the second driver circuit; a second logic circuit for providing an active command indicating occurrence of an activity; and at least one additional transistor for receiving the active command; wherein the first and second driver circuits provide a substantial portion of the supply voltage and current to the high speed memory device and the at least one additional transistor provides additional supply current in response to the active command.

In another preferred embodiment, the present invention includes a method of providing a supply voltage and current to a high-speed memory device having a voltage down converter, the method including providing a steady state current to the memory device by way of a first driver circuit including a first comparator and a steady driver transistor having a large transistor width; providing a fluctuating current to the memory device by way of a second driver circuit including a second comparator an active driver transistor having a small transistor width relative to the steady driver; and providing additional current to the memory device by way of at least one additional transistor in response to an active command received from a logic circuit, the active command indicating occurrence of an activity.

In another preferred embodiment, the present invention includes a method for supplying a voltage to a random access memory circuit within an integrated circuit device, the integrated circuit device having an input pin for receiving an external high voltage, the method including connecting the input pin through a series pass transistor to a power supply voltage output node and regulating said series pass transistor to generate a substantially constant high power supply voltage that is greater than a logic "1" voltage level stored in a memory cell.

DETAILED DESCRIPTION

Figure 1A:
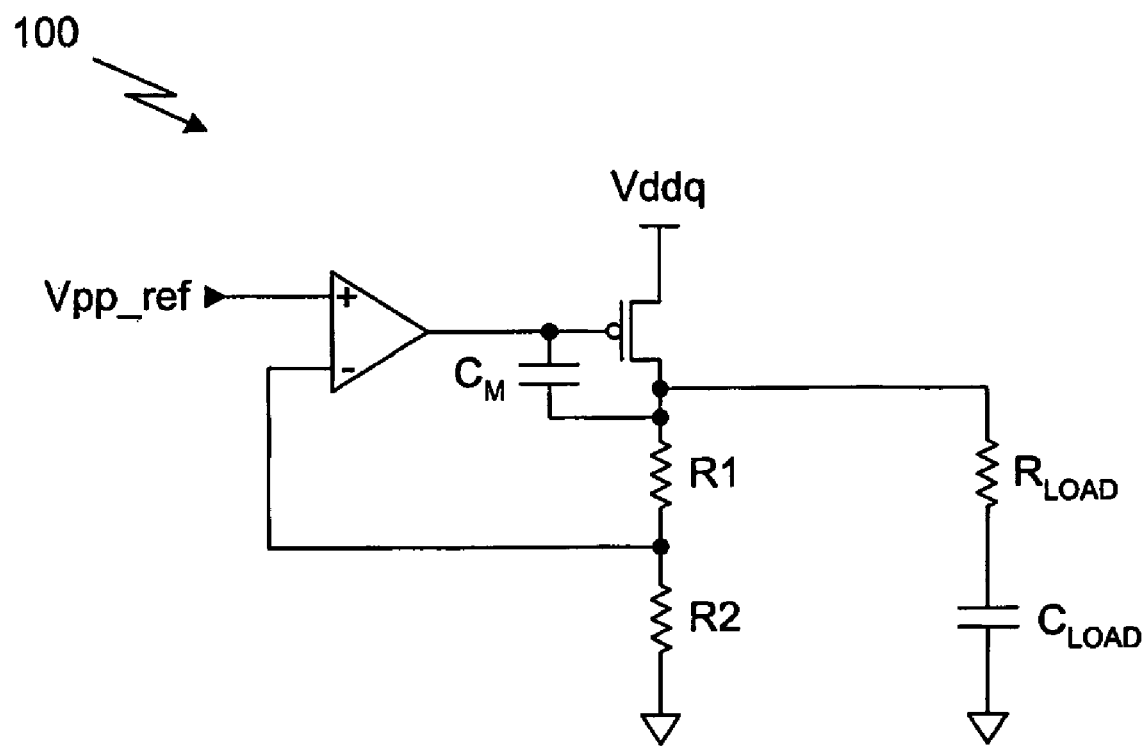
FIGS. 1A and 1B are examples of prior art voltage down converters.
Figure 1B:
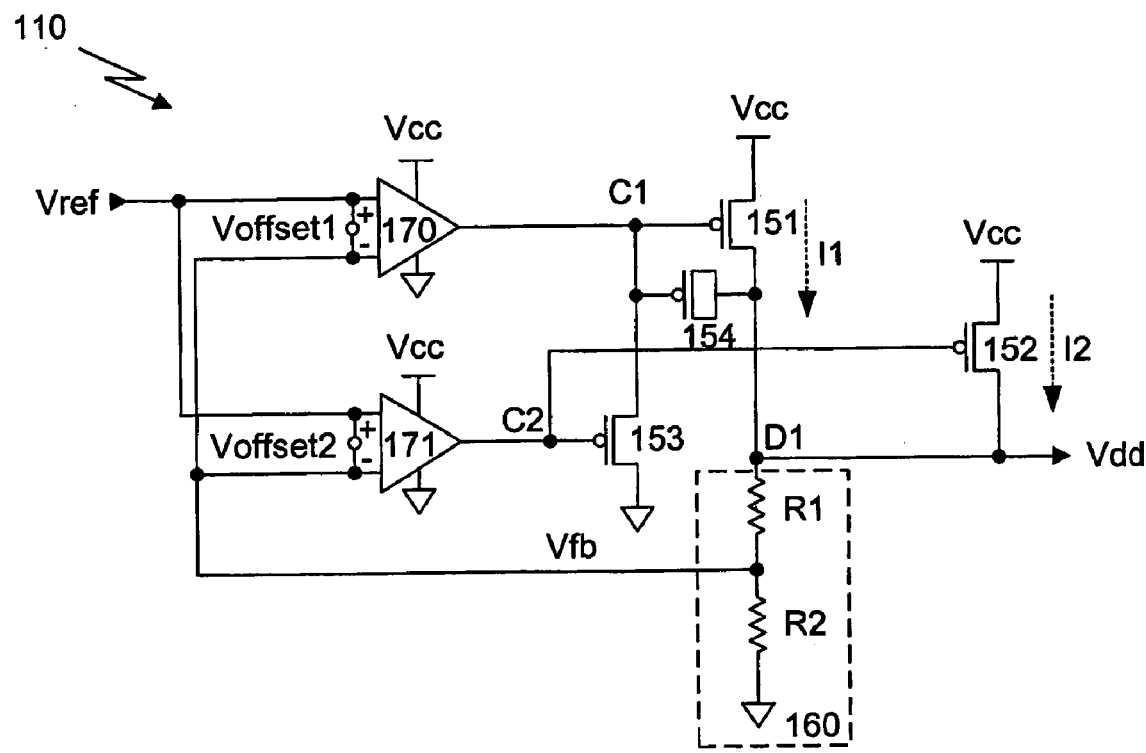
Figure 2:
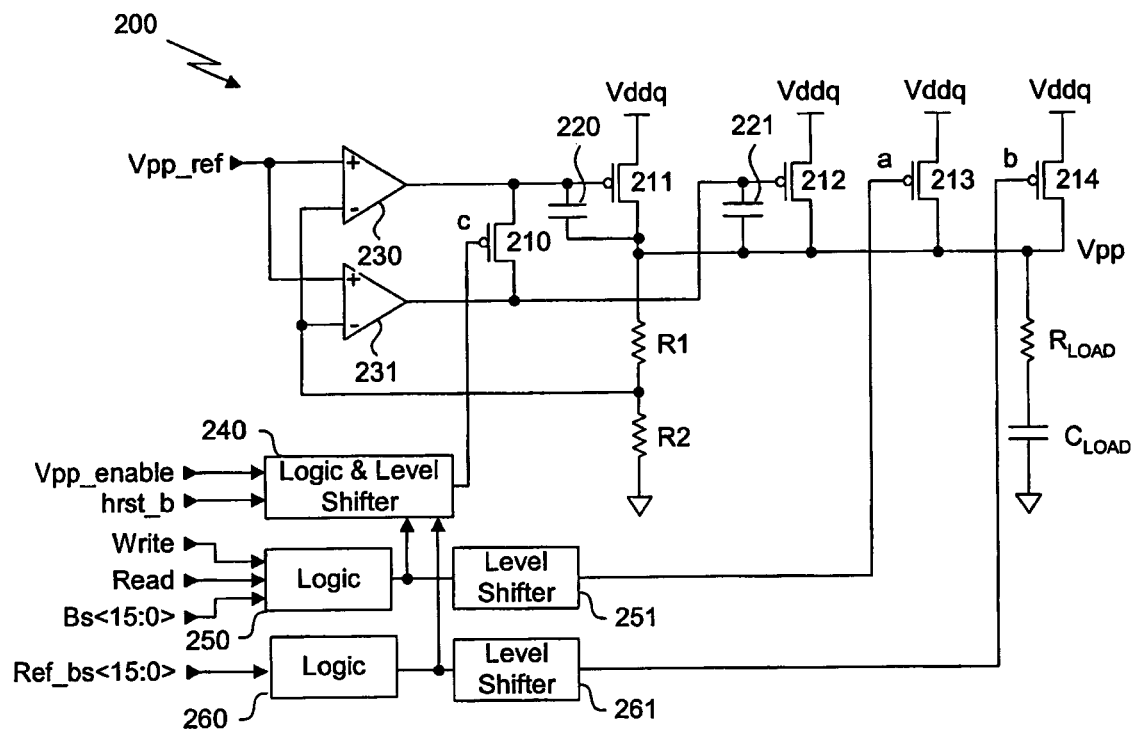
FIG. 2 is a schematic diagram of a voltage down converter in accordance with an embodiment of the present invention.

With reference to FIG. 2, a Voltage Down Converter (VDC) 200 in accordance with one embodiment of the present invention is shown. The VDC of the invention is designed to generate a substantially constant high voltage VPP, that is greater than the logic "1" voltage level stored in a memory cell. The present VDC uses the external high voltage provided to an input pin of an integrated circuit that has a memory circuit, in order to generate the VPP voltage without the use of a charge pump. The VDC includes a standby main driver 211 with high gain and low frequency response, an active driver 212 with low gain and high frequency response, and two additional transistors 213, 214, and the relevant circuitry such as a regulator 230, 231. The main driver 211 and the active driver 212 are implemented in a series pass configuration. The two additional transistors 213, 214 are in the form of PMOS drivers and receive in their gate a digital control signal. For clarity of illustration and for the purposes of distinguishing such additional transistors from the standby 211 and active drivers 212 mentioned within this description, such additional transistors 213, 214 will be hereinafter referenced as "active charge injector transistors." However, it should be well understood that such nomenclature including the term "charge injector" should not be considered as limiting such elements to any previously understood or known definition of "charge injector transistor" or "active charge injector transistor."

The charge injector transistors 213, 214 are used to provide a pulsed increase in the current into the VPP voltage power supply node, to compensate for the load current increases occurring during read, write and/or refresh active operations. The charge injector transistor is implemented in a series pass configuration. The signal that controls the operation of the charge injector transistors 213, 214 is generated during the read, write and/or refresh operations or in anticipation of such operations. Preferably, the dimensions of the charge injector transistors 213, 214 are designed to provide the necessary current that is sufficient to compensate for the increase in the load during an active cycle. The time that the control signal is applied to turn on the charge injector transistors is set so that the required amount of load-compensating current is supplied through these transistors 213, 214 to the VPP voltage output, so the VPP voltage level is maintained stable during the read, write and/or refresh operations. In a further embodiment, the time of the active pulse is programmed to compensate for temperature, voltage and process variations.

FIG. 2 includes a regulator that is shown as two comparators 230, 231 that include a PMOS current mirror load and two NMOS (negative channel metal oxide semiconductor) series-connected differential inputs and bias control NMOS connected to ground. Decoding logic is used to combine the read, write, and refresh operations with information of which single or double memory bank is accessed, to generate a control signal to enable one active charge injector transistor. Such decoding logic 240, 250, 260 and level shifter elements 251, 261 are embodied by appropriate circuitry (e.g., D-flip flops and logic gates) well known within the area of digital circuits and need not be further described herein. Numerous examples of level shifters exist throughout the prior art and may be used without straying from the intended scope of the present invention. One such example of a level shifter is described in U.S. Pat. No. 5,214,602 to Lines. It should further be understood that while read and write command functions are not performed together, read and write may be performed simultaneous with the refresh command function. Each command insertion issues a "one" pulse with proper width that is trimmable. If this pulse width is too wide due to the process, voltage and/or temperature (PVT) variation of silicon, the pulse is merged to the next pulse and generates a static low signal by internal logic circuitry. In a further embodiment of the invention, the trimming of the pulse with of the control signal can be used to compensate for PVT.

The PMOS switch 210 shown in FIG. 2 advantageously increases the stability of the negative feedback amplifier. This switch 210 is only selectively active. During the power-up stage and the recovery of Vpp level after re-enabling Vpp regulation by the Vpp-enable signal, the switch 210 is turned on and operated together with the standby main PMOS driver 211 to prevent the oscillation of Vpp from the active driver 212. A first active command such as read or write turns this switch 210 off so that the active driver 212 is independently operated.

The Miller compensation capacitor D4 shown in FIG. 2 prevents the Vpp oscillation caused by the small load capacitance $C_{Load}$ and high Vpp current. The steady driver can be operated with more stability by this Miller capacitor that, for example, may be in the range of 10 pF. A second Miller compensation capacitor 221 is shown that has the same functionality as capacitor 220, though with a much reduced size, for example, in the range of 2 pF. Reducing the size of this second capacitor 221 greatly facilitates application of the inventive VCD within smaller and smaller high-speed memory devices.

More specifically, elements 211 through 214 include four PMOS drivers including a steady driver 211, an active driver 212, an active charge injector transistor 213 for read/write, and an active charge injector transistor 214 for refresh. While only two active charge injector transistors 213, 214 are shown, it should be understood that more than two are possible if additional command functions beyond read, write, read and refresh, write and refresh and refresh operations are performed. Similarly, it should be readily apparent that only one active charge injector transistor is required to perform the function in accordance with the present invention if a refresh operation is not performed in parallel to the read or write operations. For illustration purposes though, two charge injector transistors 213, 214 are shown. Such additional active charge injector transistors should therefore be considered to be well within the intended scope of the present invention. During power-up and all operation conditions, the steady driver 211 takes control of Vpp. During power-up, the active driver 212 has the same gate control level as the steady driver 211. However, after asserting a first command, the active driver 212 operates independently according to Vpp level in order to respond quickly. The active charge injector transistors 213, 214 each operate in relation to a corresponding command insertion—e.g., the active charge injector transistor 213 of read and write is activated upon a read command. In this way, two separate PMOS are able to easily react to the peak current of single word line access and double word lines. One PMOS charge injection current is trimmed as much as the requirement of a single command, that is, a single word line activation.

In practice, the steady driver 211 will have a large transistor width relative to the active driver 212. Moreover, each active charge injector transistor 213, 214 will have even smaller transistor widths than the active driver 212. As shown in FIG. 2, the active charge injector transistors 213, 214 may have a small W/2 transistor width, but may be ¼ width or less depending upon the given architecture and related load on the given array. Such modifications are possible so long as the size of the transistors is enough to compensate for current load of performing an active cycle in the memory.

In operation, the active driver 212 moves down faster than the steady driver 211 because of the small Miller compensation capacitor 220 and small driver size. However, drastic voltage drop is avoided by the active charge injector transistor operation such that the active charge injector transistors 213, 214 preserve the Vpp level without using complicated control logic decoding. It should be understood that the charge injector transistor logic is implemented using delays and D-flip flops where the additional logic is negligible relative to known manner of providing a huge reservoir capacitor to be able to keep Vpp at a desired level. Further, the fast response of the active charge injector transistor elements 213, 214 does not require any feedback loop to ensure the quick recovery of Vpp level. As well, PVT variation of the Vpp level and current consumption can be tuned by pulse width control for process variation. Voltage and temperature variation are basically resolved with PMOS driver temperature and voltage variation of turn-on current without trimming.

The three relevant states of operation in regard to the VCD of the present invention include power-up, standby mode, and consecutive active mode. During the power-up period, Vpp and control signals seek the corresponding levels to follow the intermittent Vpp reference level until a source voltage of Vpp (Vddq in this example) boosts up to the determined level. In this way, large current is not issued because of a long power-up time. For standby mode, static DC current by transistor leakage is invoked where no significant transient from the Vpp load capacitor $C_{Load}$ occurs and the steady and active drivers are tied together through the PMOS switch 210. The regulator 230, 231 finds the final optimized Vpp level according to the Vpp reference voltage level. Any steady voltage drop of Vpp is compensated from the steady 211 and active 212 drivers.

For consecutive active mode, huge and drastically sinking current from the Vpp load capacitor $C_{Load}$ is demanded by the word line activation and relevant circuitry such as the level shifter 251 or 261 into a word line control block. Because of the slow response of the steady driver 211 and active 212 driver at high frequency—e.g., 1 GHz operation of the consecutive read or write with concurrent refresh that is a twice higher peak current than single operation—, the Vpp level drops abruptly. In order to facilitate the recovery of this sudden drop of Vpp, the active charge injector transistors are enabled depending on the command types such as single bank access (e.g., single read or write or refresh) and double bank access (e.g., read or write with concurrent refresh). For single bank access, only one of two active charge injector transistors 213, 214 are activated by a single pulse generated from a pulse generator (not shown) involved in the combinational logic block. A double bank access triggers both of the active charge injector transistors 213, 214 so that the increased Vpp current is easily recovered.

Figure 3:
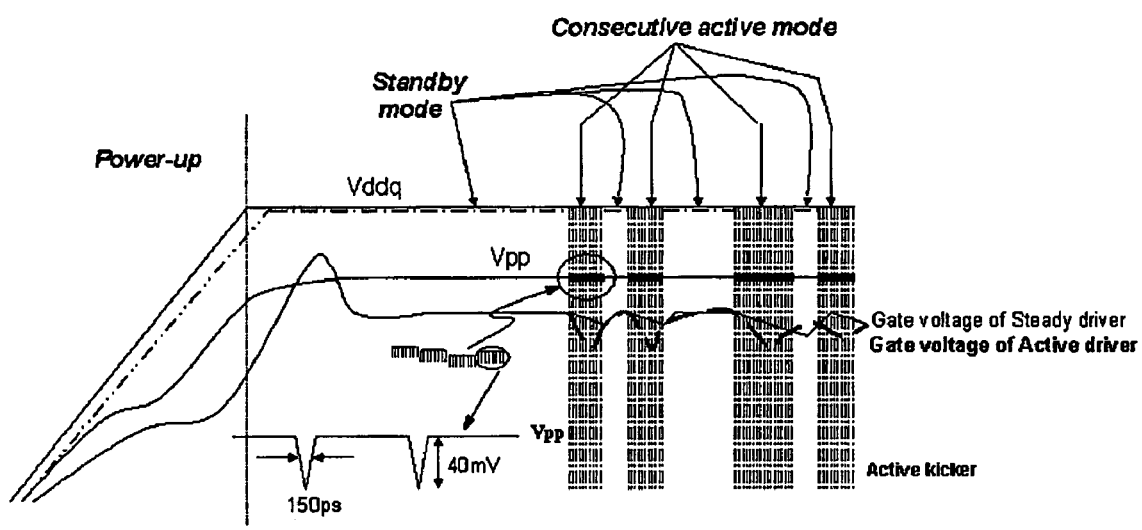
FIG. 3 is a graphical representation of power-up, standby mode, and consecutive active mode in accordance with the present invention.

From FIG. 3, power-up, standby, and consecutive active mode are shown graphically. While specific values are shown, they should be understood to be only examples for purposes of illustration and not considered limiting. The consecutive active mode is of most concern, especially where a command with concurrent refresh exists which has a double bank access invoking twice higher peak current from Vpp. In such instance, the quick response cannot be expected from the steady driver. Furthermore, the feedback provided to the comparator does not have a sufficiently fast response in order to increase the current provided by the active driver to restore the charge that the memory consumes during an active mode. Without the use of the charge injector transistors, the Vpp level would go down for example, less than 1.5 v thus potentially creating problems for writing into the accessed cell. This is prevented by the use of the active charge injector transistor. When the active charge injector transistor is enabled by its control signal, the loss charge of the Vpp output node is restored.

Figure 4:
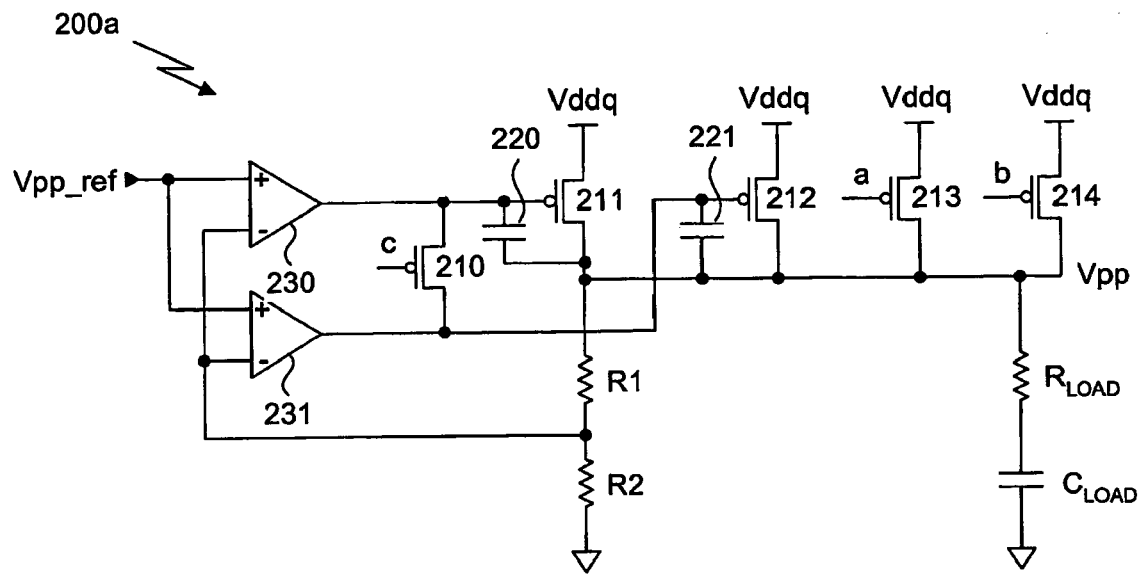
FIG. 4 is a simplified version of the schematic diagram of FIG. 2 showing features of power-up and standby modes in accordance with an embodiment of the present invention.
Figure 5:
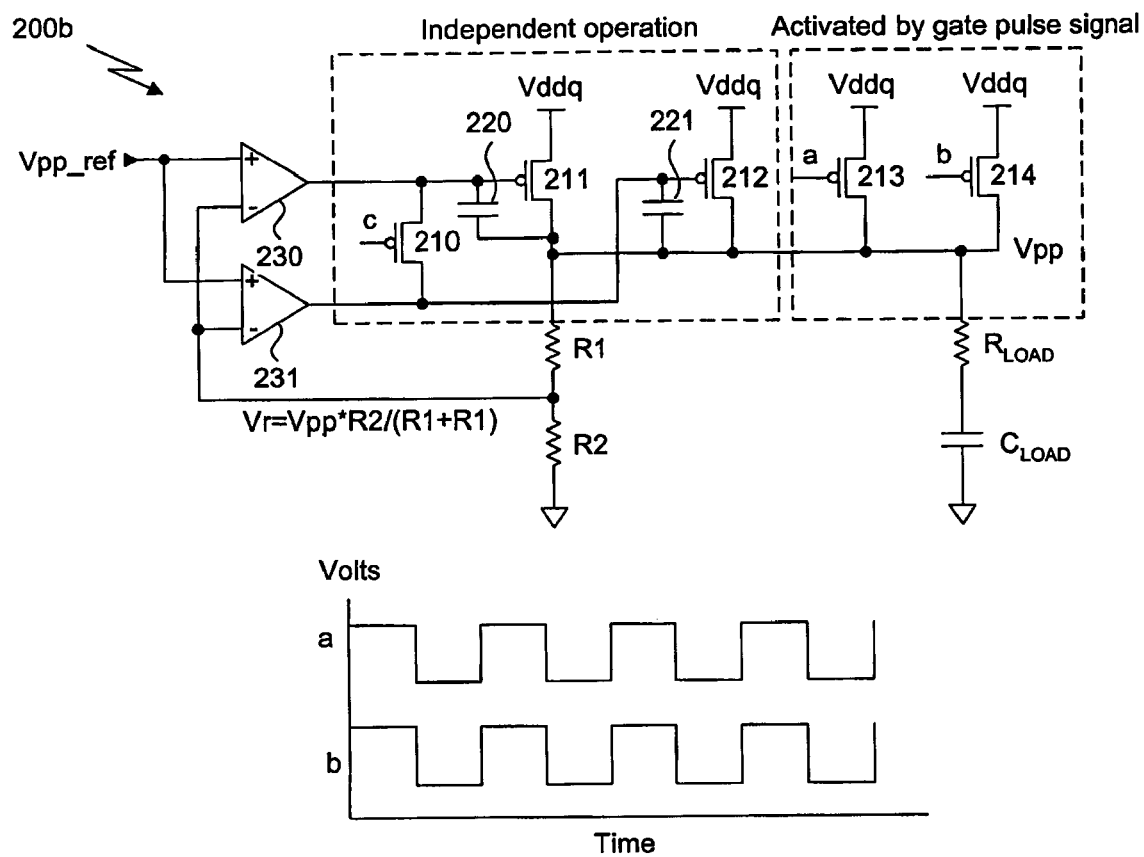
FIG. 5 is a simplified version of the schematic diagram of FIG. 2 showing features of gate control of additional transistors provided in accordance with an embodiment of the present invention.

FIG. 4 is a simplified version of FIG. 2 that illustrates operation of the VCD circuit in power-up and standby modes. FIG. 4 shows that the steady 211 and active 212 drivers are driven by the two regulators 230, 231 so as to determine the Vpp level for power-up and standby mode. The regulator 230, 231 takes a control of the Vpp level with Vpp_ref that is set by the reference generator. During power-up and standby mode (i.e., steady state), only the steady 211 and active 212 drivers are activated and electrically tied together through PMOS switch 210. However, as further illustrated by FIG. 5, all drivers 211 through 214 including the active charge injector transistors 213, 214 are activated to quickly restore the Vpp level without any significant drop of Vpp level. Further, the pulse width of the control signal provided to the gates of the charge injector transistors 213, 214 is trimmable so that the VCD 200*b* can supply as much as whatever Vpp current is sunk by the active operations of the memory.

Figure 6:
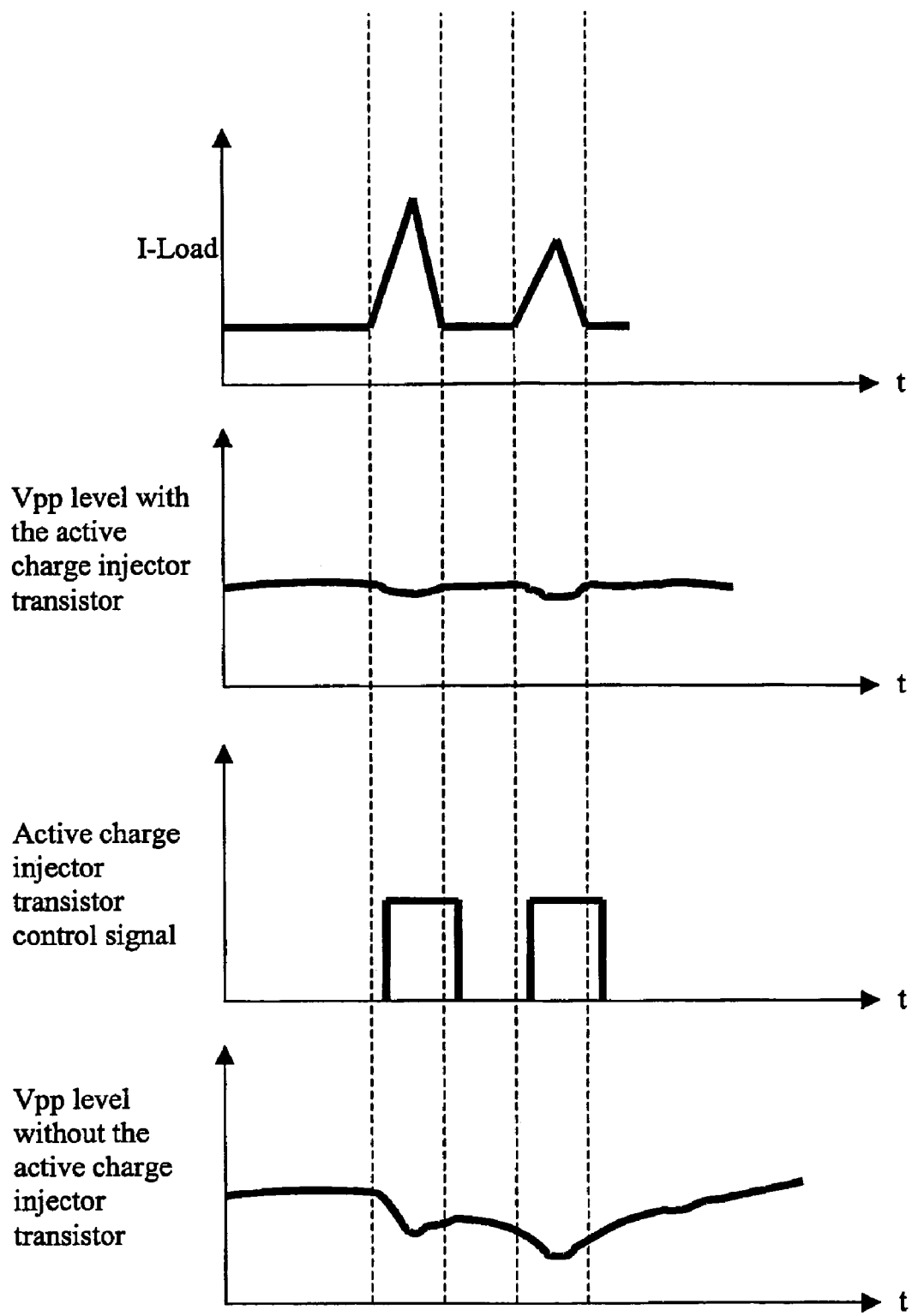
FIG. 6 is a graphical comparison of the schematic diagram of FIG. 2 in accordance with an embodiment of the present invention relative to operating voltages without benefit of the present invention.

FIG. 6 is a graphical illustration that shows a simplified version of Vpp with an addition of an active charge injector transistor in accordance with the present invention and Vpp without an active charge injector transistor. The top graph in FIG. 6 shows a load current with two peaks in the load that indicate an active cycle in the memory array in which an operation occurs such as read, write, or refresh. The impact on Vpp without the benefit of an active charge injector transistor is shown at the bottom graph where Vpp initially drops upon increase in load current, fails to fully recover, drops again upon a second increase in load current, and subsequently slowly recovers to full value. The graph labelled "Vpp with charge injector transistor" shows the impact of the present invention on Vpp whereby Vpp suffers from only minor fluctuations and regains full value quickly after each increase in load current. As the active charge injector transistor in accordance with the present invention is digitally controlled, the graph labelled "charge injector transistor control signal" is provided to indicate activation of the active charge injector transistor. Though over-simplified for purposes of illustration, it should be noted that a slight delay of course occurs from the time activity in the array begins until the time that a pulse is provided to the active charge injector transistor. In a further embodiment of the invention, the activation of the charge injector transistor can be set to start at the time that the word line drivers are activated, so the current load is quickly compensated. In yet another embodiment of the invention, the activation of the charge injector transistor can be set to be earlier than the activation of the word line drivers so a drop on the Vpp voltage level is avoided completely. It would be obvious to someone skilled in the art that trimming can be used to set the best results and achieve the best stability of the Vpp voltage or to better accommodate the particular needs of their memories.

The present invention is useful in any small sized memory with high-speed operation including, but not limited to, embedded DRAM. It is especially useful where developers are unable to acquire enough space on-chip to place a huge reservoir capacitor, especially within devices having an operating frequency over 700 MHz. For large arrays, the present invention may be provided in a multi-bank version such that several separate banks of memory on a single chip may be served by multiple VCDs in accordance with the present invention. For instance, four memory blocks may be made independent such that access can differ where perhaps a first memory block may be read while a second memory block may be written. In such instance, the present invention may be provided in a multiple format to serve each block independently. The present invention also reduces the need for embedded memory to have an independent external power supply to resolve large drops within any internal power source. The present invention further presents a VCD with fast operation of over 1 GHz with a large Vpp current and a very small physical size requirement that are all important features of embedded memory products.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A voltage down converter for providing a supply voltage and current to a high-speed memory device, said converter comprising:

a first driver circuit including a first comparator and a steady driver transistor having a large transistor width;

a second driver circuit including a second comparator and an active driver transistor having a small transistor width relative to said steady driver;

a first logic circuit for connecting said first driver circuit and said second driver circuit;

a second logic circuit for providing an active command indicating occurrence of an activity; and at least one additional transistor for receiving said active command;

wherein said first and second driver circuits provide a substantial portion of said supply voltage and current to said high speed memory device and said at least one additional transistor provides additional supply current in response to said active command.

2. The converter as claimed in claim 1 wherein said first logic circuit connects said first driver circuit and said second driver via a transistor switch.

3. The converter as claimed in claim 2 wherein said transistor switch, in response to an output signal of said first logic circuit, connects a base of said steady driver transistor to a base of said active driver transistor during start-up of said high speed memory device.

4. The converter as claimed in claim 2 wherein said transistor switch, in response to an output signal of said first logic circuit, ties an output of said first comparator together with an output of said second comparator to bases of both said steady driver transistor and said active driver transistor during start-up of said high speed memory device.

5. The converter as claimed in claim 2 wherein said second logic circuit includes a combination logic circuit and a level shifter circuit that provides said active command forming a pulse signal to activate said at least one additional transistor to drive said additional supply voltage and current such that said substantial portion of said supply voltage and current combined with said additional supply voltage and current compensate for operating load losses during said occurrence of said activity.

6. The converter as claimed in claim 5 wherein said activity is selected from the group consisting of reading from memory, writing to memory, and refreshing memory.

7. The converter as claimed in claim 5 further including
   a second additional transistor and
   a third logic circuit including another combination logic circuit and corresponding level shifter circuit that provides a second active command indicating occurrence of an additional activity, said second active command forming a second pulse signal to activate said second additional transistor to drive further additional supply voltage and current such that said substantial portion of said supply voltage and current combined with both said additional supply voltage and current and said further additional supply voltage and current compensate for said operating load losses during said occurrences of said activity and said additional activity.

8. The converter as claimed in claim 7 wherein said activity is selected from the group consisting of reading from memory and writing to memory.

9. The converter as claimed in claim 8 wherein said additional activity is refreshing memory.

* * * * *